United States Patent
Banerjee et al.

(10) Patent No.: US 11,227,651 B2
(45) Date of Patent: Jan. 18, 2022

(54) STATIC RANDOM ACCESS MEMORY READ PATH WITH LATCH

(71) Applicant: Advanced Micro Devices, Inc., Santa Clara, CA (US)

(72) Inventors: Arijit Banerjee, Austin, TX (US); Russell Schreiber, Austin, TX (US); Kyle Whittle, Fort Collins, CO (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/692,714

(22) Filed: Nov. 22, 2019

(65) Prior Publication Data
US 2021/0158855 A1  May 27, 2021

(51) Int. Cl.
| | |
|---|---|
| *G11C 7/00* | (2006.01) |
| *G11C 11/4091* | (2006.01) |
| *G11C 11/419* | (2006.01) |
| *G11C 7/10* | (2006.01) |
| *G11C 11/4074* | (2006.01) |

(52) U.S. Cl.
CPC .......... *G11C 11/4091* (2013.01); *G11C 7/106* (2013.01); *G11C 7/1087* (2013.01); *G11C 11/4074* (2013.01); *G11C 11/419* (2013.01)

(58) Field of Classification Search
CPC .................................. G11C 11/4091
USPC ........................................ 365/203
See application file for complete search history.

(56) References Cited

U.S. PATENT DOCUMENTS

| | | | |
|---|---|---|---|
| 6,642,749 B1 * | 11/2003 | Wu .......... | G11C 7/065 327/55 |
| 2009/0147575 A1 * | 6/2009 | Nam ......... | G11C 16/26 365/185.03 |
| 2012/0235708 A1 * | 9/2012 | Slamowitz .......... | G11C 7/062 327/53 |

* cited by examiner

*Primary Examiner* — Hoai V Ho
(74) *Attorney, Agent, or Firm* — Park, Vaughan, Fleming & Dowler LLP

(57) ABSTRACT

A read path for reading data from a memory includes a sense amplifier having data (SAT) and data complement (SAC) output nodes and a latch. The latch includes an input tri-state inverter including first and second PMOS transistors connected between VDD and an intermediate node, and first and second NMOS transistors connected between VSS and the intermediate node. A gate connection of the first PMOS and NMOS transistors is connected to the SAT node; a gate connection of the second PMOS transistor is connected to a sense amplifier enable complement input; and a gate connection of the second NMOS transistor is connected to a sense amplifier enable input. The latch also includes an output driver with an input connected to the intermediate node and an output connected to a data output node. The latch thus has two gate delays between the SAT node and the data output node.

22 Claims, 6 Drawing Sheets

STATIC RANDOM ACCESS MEMORY READ PATH WITH LATCH

BACKGROUND

Related Art

Many electronic devices include integrated circuit memories that are used for storing copies of data (i.e., results from operations, operands, instructions, control values, and/or other information). For example, some electronic devices include cache memories that are used for locally storing copies of data to enable rapid retrieval of the data during operation by entities such as processor cores. Some of these memories include static random access memory (SRAM). SRAM is a form of integrated circuit memory in which separate cells (or "bit cells"), which are implemented using field effect transistors, are used for storing individual bits of data. For example, in one common form of SRAM, each cell is implemented using six transistors, configured as two back to back inverters for storing data and two access transistors for accessing stored data. In some SRAM memories, data stored in cells is read via read paths that include sense amplifiers and latches. In a given read path, the sense amplifier generates a read data output based on stored data values acquired from a cell and the latch captures and stores the read data output from the sense amplifier and provides the read data output to downstream circuit elements.

In some electronic devices, SRAM memories are part of circuitry that is on critical timing paths. For example, an SRAM cache memory may be used to supply operands to high-speed processor cores—and may be among the longest-latency elements in timing paths associated with computational operations that rely on the operands. In addition, in some electronic devices, SRAM memories must be able to operate correctly in a range of different controlling clock frequencies. For example, SRAM memories can be required to support different operating states, electrical power modes, etc. having a wide range of controlling clock frequencies. In some electronic devices, controlling clock frequencies may be set sufficiently low that short circuits occur as the read path operates, which lead to undesirable and inefficient leakage currents—and possibly to functional failures. Designers have spent considerable effort optimizing SRAM memory read paths to meet the twin goals of improving the operating speed of the SRAM memory read paths while also avoiding inefficiency and functional failures that can occur in the SRAM memory read paths at lower controlling clock frequencies. For example, designers have proposed using the latch circuit shown in FIG. 1 in SRAM memory read paths. The latch circuit in FIG. 1 includes a NOR gate set-reset latch along with logic gates that use the complement of a sense amplifier enable signal (SAENX) to avoid short circuit currents and functional failures (i.e., hold failures) during lower frequency operation of the read path. As another example, designers have proposed using the latch circuit shown in FIG. 2 in SRAM memory read paths. The latch circuit in FIG. 2 includes an AND-OR-invert latch that is gated using the SAENX signal to avoid short circuit currents and functional failures during lower frequency operation of the read path. Although using latch circuits such as those shown in FIGS. 1-2 can result in higher speed operation of the read path while avoiding leakage currents at lower frequencies, the latch circuits include three gates worth of delay on the read path, have different rise and fall times, and have other shortcomings. A better read path for SRAM memories is therefore desirable.

BRIEF DESCRIPTION OF THE FIGURES

Throughout the figures and the description, like reference numerals refer to the same figure elements.

DETAILED DESCRIPTION

Figure 1:
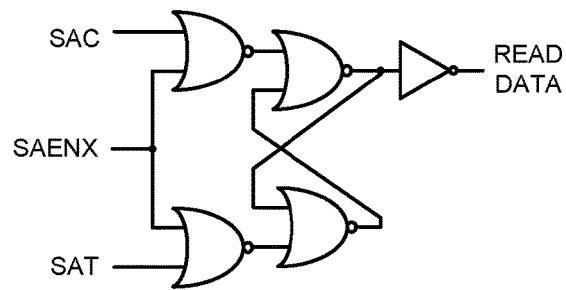
FIG. 1 presents a block diagram illustrating a NOR latch for a read path for an SRAM memory.
Figure 2:
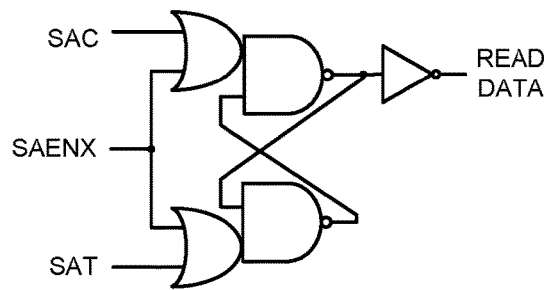
FIG. 2 presents a block diagram illustrating an AND-OR-invert (AOI) latch for a read path for an SRAM memory.

The following description is presented to enable any person skilled in the art to make and use the described embodiments and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Terminology

In the following description, various terms are used for describing embodiments. The following is a simplified and general description of some of these terms. Note that these terms may have significant additional aspects that are not recited herein for clarity and brevity and thus the description is not intended to limit these terms.

Functional block: functional block refers to a group, collection, and/or set of one or more interrelated circuit elements such as integrated circuit elements, discrete circuit elements, etc. The circuit elements are "interrelated" in that circuit elements share at least one property. For example, the interrelated circuit elements may be included in, fabricated on, or otherwise coupled to a particular integrated circuit chip or portion thereof, may be involved in the performance of given functions (computational or processing functions, memory functions, etc.), may be controlled by a common control element and/or a common clock, etc. A functional block can include any number of circuit elements, from a single circuit element (e.g., a single integrated circuit logic gate) to millions or billions of circuit elements (e.g., an integrated circuit memory).

Complement: complement, as applied to signals, indicates that a given signal is the logical inversion of another signal. For example, the "bit line complement" signal is the logical inversion of the "bit line" signal, and thus if the bit line is a logical high value (e.g., approximately VDD), then, in a steady state, the bit line complement will be a logical low value (e.g., approximately VSS). A signal and its complement can be found on opposite sides of certain inverting circuit elements such as inverters, cells in an SRAM memory, etc. In this description, a complement of a signal can be indicated using an X attached to the end of the signal label, so that a signal labeled "SIGNALX" is the complement of a signal labeled "SIGNAL."

Signal: signal refers to values of voltage, current, or other property of an electrical path, route, guide, and/or other interconnect that are driven, provided, or otherwise made available by a providing electrical circuit element to be received by one or more receiving circuit elements. For example, a buffer circuit element may drive a signal having a logical high voltage value (e.g., approximately VDD) onto a metal trace, where the signal is received by a storage circuit element such as a latch or a flip-flop circuit element. Providing circuit elements can vary signals over time within a permissible range of voltage, current, or other property based on changes in input stimuli to the providing circuit elements. For example, an inverter circuit element can initially output a logical high voltage value, but can transition to outputting a logical low voltage value (e.g., approximately VSS) or an intermediate voltage value between VDD and VSS based on a corresponding change of an input to the inverter. In some cases, signals are constant, such as a signal that is driven steadily at a logical high value (e.g., approximately VSS) or a logical low value (e.g., approximately VDD).

Gate delay: gate delay is an approximate and relative measurement for comparing the performance of different integrated circuits. Generally, gate delay represents the number of transistors (often in inverting circuit elements) through which signals traverse on a path through an integrated circuit. Gate delay is therefore a rough gauge of the flight time of signals through the path. Using an inverter implemented using metal oxide silicon field effect transistors ("transistors") as an example, a gate delay is approximately a time between a transition of a signal connected to the input of the inverter—and thus to gate connections of the constituent transistors—and the corresponding transition of the output of the inverter.

Overview

In the described embodiments, an electronic device includes an integrated circuit memory in which data (e.g., operands for computational operations, results from operations, instructions, configuration values, tag information, and/or other information) is stored. For example, in some embodiments, the memory is or is included in a cache memory, a tag array in a cache memory, a main memory, and/or another memory. The memory includes static random access memory (SRAM) circuits, in which bits of data are stored in cells that are implemented using field effect transistors (or, more simply, "transistors"). For example, in some embodiments, each cell is implemented using six transistors, with four of the transistors configured as back to back inverters for storing a bit of data and two of the transistors configured as access transistors for enabling (or disabling) accesses (i.e., reads and writes) of the stored data. In the described embodiments, data is read from each cell in the memory via circuit elements in a corresponding "read path." Each read path includes circuit elements, i.e., a sense amplifier ("sense amp") and a latch, for acquiring data from one or more of the cells and providing the data to receiving circuit elements. Generally, in the described embodiments, the circuit elements in read paths are selected and arranged so that: (1) there are only two gate delays between an output of the sense amplifier and a data output of the read path; (2) short circuit currents and functional failures (e.g., hold failures for the latch) associated lower-frequency operation of the read path are avoided; (3) a capacitive load on the sense amplifier is balanced; and (4) rise/fall times of the latch are more symmetric (i.e., than existing read path latch designs).

In the described embodiments, latches in read paths for the memory are implemented using an arrangement of circuit elements that includes only two gate delays in the read path between an output of the sense amplifier and a data output from the read path. In this arrangement, the first gate (and thus the first gate delay) in the read path in each latch is a tri-state inverter. A sense amplifier enable signal (SAEN) and its complement (SAENX) for that read path are used to control when the tri-state inverter signals, on an output of the tri-state inverter that is coupled to an intermediate node of the latch, an inverted version of an input signal that is received from a sense amplifier (SAT) output of the sense amplifier for that read path. The second gate in the read path in each latch is an output driver (e.g., an output inverter, a NAND gate, a tristate inverter, etc.). The output driver receives the signal from the intermediate node of the latch as an input and outputs an inverted version of the signal from the intermediate node as a data output of that read path. In addition to these two gates, each of the latches includes a memory element coupled to the intermediate node of that latch that maintains values on the intermediate node of that latch (and thus is the circuit element that "stores" data in that latch). The memory element includes a back to back pair of an inverter and a tri-state inverter, the tri-state inverter being controlled using the SAENX and SAEN signals.

Due to the arrangement of circuit elements in the sense amplifier and the latch, without some form of protection, short circuit currents can occur in read paths due to short circuit paths that are formed when certain control signals overlap in time, particularly at lower controlling clock frequencies. For example, in a design where a sense amplifier precharge (SAPC) signal alone is used to trigger precharging (i.e., to cause precharging circuit in the sense amplifier to precharge SAT and sense amplifier complement (SAC) nodes), when the SAPC signal is asserted while the SAEN signal is also asserted, a short circuit path can occur in the sense amplifier itself. As another example, when the SAPC signal is asserted while the latch is enabled (via the SAEN signal), a short circuit path can occur via the sense amplifier and the latch—and can lead to functional failures due to the corruption of data stored in the latch. The described embodiments include a precharge control circuit that controls when the precharge circuit precharges the sense amplifier in order to avoid short circuit currents. In the described embodiments, the precharge control circuit receives, as inputs, the SAPC and SAENX signals, and outputs, based on values of the SAPC and SAENX signals, a sense amplifier precharge complement (SAPCX) signal that causes a precharge circuit in the sense amplifier to precharge the sense amplifier. By using the SAENX signal to control when the sense amplifier is precharged, the precharge of the sense amplifier and the enabling of the sense amplifier and latch should not overlap—which provides protection from the associated short circuit currents.

In the described embodiments, the capacitive load on the sense amplifier in each read path is balanced using a load balancing circuit. The load balancing circuit is connected to a sense amplifier complement (SAC) node of the sense amplifier and provides a capacitive load on the SAC node. In some embodiments, the load balancing circuit includes a tri-state inverter, with the gate connections for two of the four transistors of the tri-state inverter (i.e., one NMOS transistor and one PMOS transistor) being connected to the SAC node and the gate connections for the other two of the transistors being connected to disable signals that keep the tri-state inverter in an off/disabled/non-conducting state. The tri-state inverter therefore presents a capacitive load to the SAC node that is similar to the capacitive load presented to the SAT node by the above-described tri-state inverter in the latch. The load balancing circuit ensures that the sense amplifier is presented with equal loads on the SAT and SAC nodes, which improves the lifetime of transistors in the sense amplifier as well as ensuring more equal rise and fall times of the SAT and SAC nodes. In some embodiments, aside from providing the capacitive load, the load balancing circuit is involved in no other operations in the read path.

In some embodiments, at least two banks of memory in an SRAM memory share part of a single read path—and thus selectively output data using the same single read data output. In these embodiments, the above-described output driver, intermediate node, and storage circuit elements in the latch are the part of the read path that is shared between the two banks of memory. Each bank of memory therefore includes its own separate sense amplifier and latch input tri-state inverter, as well as including its own load balancing circuit and precharge control circuit. In these embodiments, the tri-state inverter in the shared portion of the read path is controlled/enabled via a combination of the individual SAEN and SAENX signals that are used in the read paths for the two banks.

By using the above-described circuit elements (i.e., latch, precharge control circuit, and the load balancing circuit) in read paths for SRAM memories, the described embodiments increase the speed of the read paths while also ensuring that short circuit currents and functional failures are avoided at lower controlling clock frequencies and the overall operation of the circuit elements is improved. This in turn enables higher performance from SRAM memories and electronic devices in which the SRAM memories are included, resulting in higher user satisfaction with the SRAM memories and electronic devices.

Electronic Device

Figure 3:
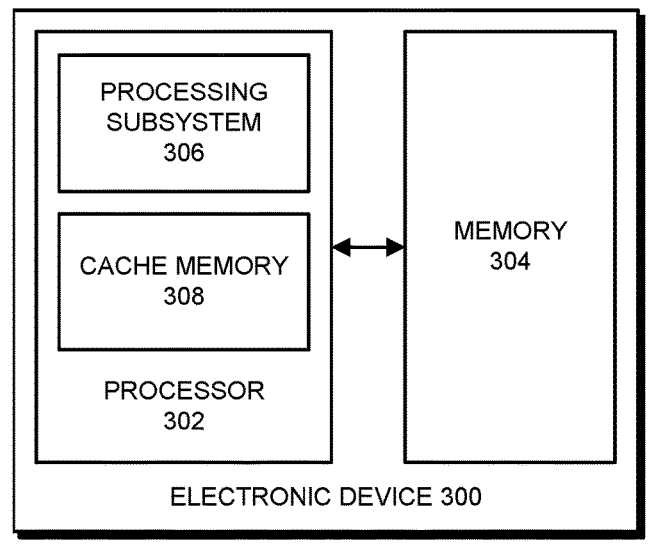
FIG. 3 presents a block diagram illustrating an electronic device in accordance with some embodiments.

FIG. 3 presents a block diagram illustrating electronic device 300 in accordance with some embodiments. Electronic device 300 includes processor 302 and memory 304. Processor 302 is a functional block that performs computational, memory access, and other operations in electronic device 300. Processor 302 includes processing subsystem 306 and cache memory 308. Processing subsystem 306 includes one or more functional blocks such as central processing unit (CPU) cores, graphics processing unit (GPU) cores, embedded processors, and/or application specific integrated circuits (ASICs) that perform general purpose computational, control, and/or other operations.

Cache memory 308 is a functional block that performs operations for storing copies of data (e.g., operands for computational operations, results from operations, instructions, configuration values, and/or other information) for access (e.g., reads, writes, etc.) by processing subsystem 306 and possibly other entities in electronic device 300. Cache memory 308 is a higher-speed memory in which copies of data are stored in order to enable the data to be accessed more rapidly than accessing the data in memory 304. In some embodiments, cache memory 308 is located closely to processing circuits in processing subsystem 306 that access the copies of data in cache memory 308 and is connected to the processing circuits via a high-speed interface, thereby enabling rapid access of stored data. In some embodiments, cache memory 308 includes volatile memory circuits such as static random access memory (SRAM) circuits that are used for storing data.

Memory 304 is a functional block that performs operations of a memory (e.g., a main memory) in electronic device 300. Memory 304 includes volatile memory circuits for storing data (e.g., operands for computational operations, results from operations, instructions, configuration values, and/or other information) for use by functional blocks in electronic device 300, as well as control circuits for handling accesses of data in the memory circuits (e.g., reads, writes, etc.). The memory circuits in memory 304 include volatile memory circuits such as fourth-generation double data rate synchronous dynamic random access memory (DDR4 SDRAM), static random access memory (SRAM), and/or other types of memory circuits. In some embodiments, copies of data are acquired from memory 304 and stored in cache memory 308 to enable more rapid access of the copies of the data.

Electronic device 300 is shown as including particular numbers and arrangements of elements (e.g., functional blocks and devices such as processor 302, memory 304, etc.). Electronic device 300, however, is simplified for illustrative purposes. In some embodiments, a different number or arrangement of elements is present in electronic device 300. For example, electronic device 300 can include power subsystems, human interface systems, etc. As another example, in some embodiments, electronic device 300 includes a mass storage device such as a disk drive or a higher-capacity integrated circuit memory that serves as non-volatile storage for data in electronic device 300—and from where copies of data are acquired for storage in memory 304 and/or cache memory 308. Generally, electronic device 300 includes sufficient elements to perform the operations herein described.

Although electronic device 300 is shown as having only a single cache memory, i.e., cache memory 308 in processor 302, electronic device 300 may include more and/or differently-arranged cache memories. For example, in some embodiments, electronic device 300 includes a hierarchy of cache memories with one or more cache memories in processor 302 and one or more cache memories external to processor 302, i.e., connected to processor 302 via one or more communication buses, etc. In these embodiments, some or all of the cache memories include SRAM memory. In addition, in some embodiments, circuits associated with and/or used for performing operations in cache memories such as tag arrays include SRAM memory.

Electronic device 300 can be, or can be included in, any electronic device that performs memory access and/or other operations. For example, electronic device 300 can be, or can be included in, electronic devices such as desktop computers, laptop computers, wearable electronic devices, tablet computers, smart phones, servers, artificial intelligence apparatuses, virtual or augmented reality equipment, network appliances, toys, audio-visual equipment, home appliances, controllers, vehicles, etc., and/or combinations thereof.

SRAM Memory

Figure 4:
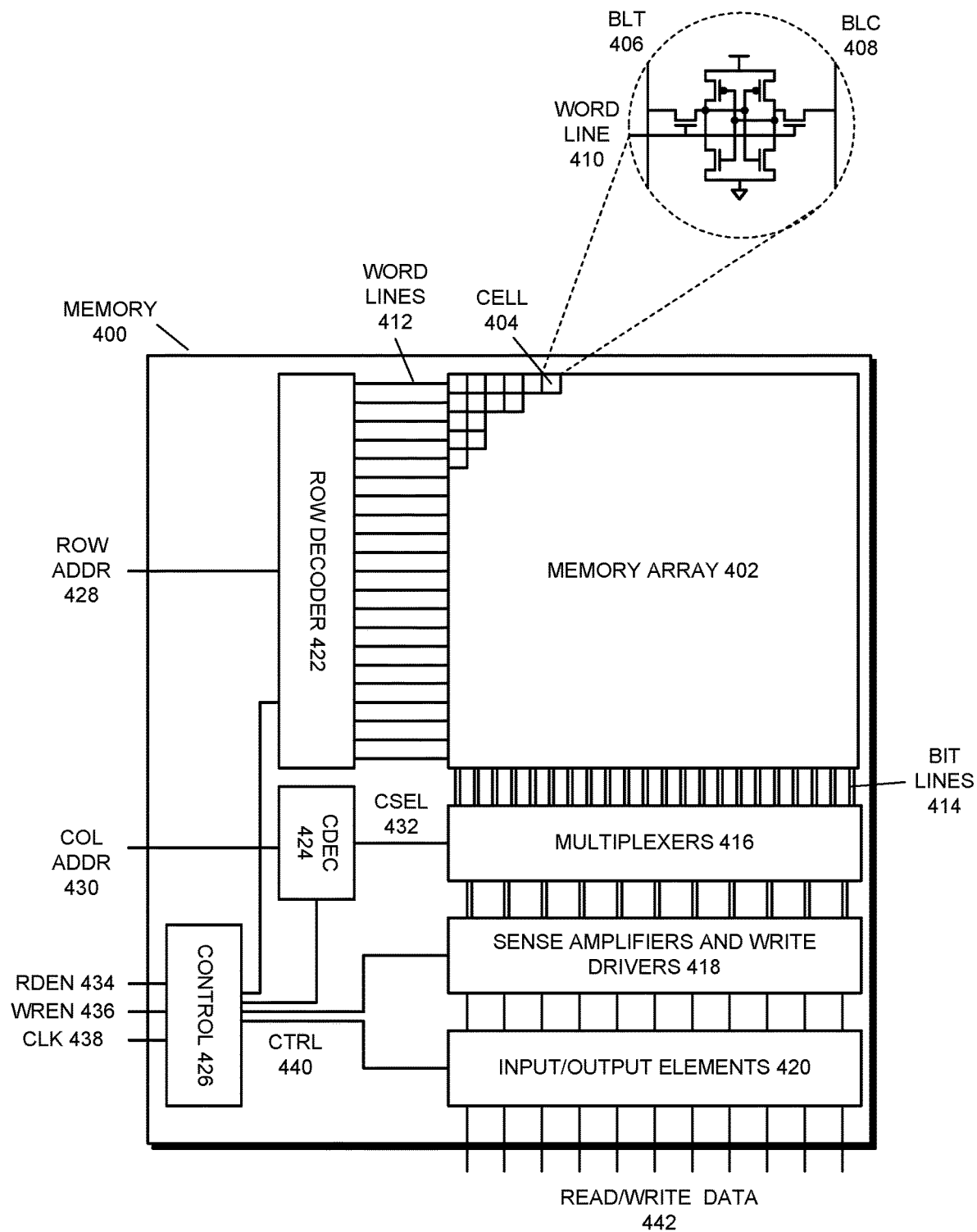
FIG. 4 presents a block diagram illustrating an SRAM memory in accordance with some embodiments.

In the described embodiments, SRAM circuits are used for storing data in memories in electronic device 300 such as cache memory 308 and/or a tag array in cache memory 308. FIG. 4 presents a block diagram illustrating a memory 400 implemented using SRAM circuits (or an "SRAM memory") in accordance with some embodiments. In some embodiments, some or all of the SRAM memories in electronic device 300 are arranged similarly to what is shown in FIG. 4, but this is not a requirement.

As can be seen in FIG. 4, memory 400 includes memory array 402, which is a functional block that includes an array of SRAM cells (or "bit cells") organized in rows and columns. A few example cells are shown in the upper left corner of memory array 402, with one of the cells labeled as cell 404 (the rest are not shown in FIG. 4 and/or labeled for clarity). As can be seen in the expanded view of cell 404 at the top of FIG. 4, cell 404 includes—as do each of the cells in memory array 402—a set of transistors for storing a bit of data and accessing the stored bit of data. More specifically, cell 404 includes six transistors, with four of the transistors (called "storage" transistors herein) configured as back to back inverters for storing the bit of data in the cell and two of the transistors (called "access" transistors herein) configured for accessing the stored bit of data. One of the two access transistors in cell 404 is connected to a bit line (BLT) 406 and the other access transistor is connected to bit line complement (BLC) 408, which are signal lines that are used for accessing data in cell 404, i.e., for reading data from and writing data to cell 404. Due to the arrangement of inversions of the back to back inverters in the cell and the nodes to which the access transistors are connected, bit line 406 accesses the value of the data stored in cell 404, while bit line complement 408 accesses the complement/logical inversion of the value of the data stored in cell 404.

Gate connections of the access transistors in cell 404 are connected to word line 410, on which is driven a signal that is used to enable or disable the access transistors and thus to selectively provide access to the storage transistors. In some embodiments, groups of N cells (where N is 16, 32, or another number) in rows in memory array 402 are connected to the same word line from among word lines 412 and are enabled (or disabled) as a group. Using word lines from word lines 412, data can therefore be accessed in groups of cells as a group. In addition, groups of M cells (where M is 16, 32, or another number) in columns are connected to the same bit line and bit line complement from among bit lines 414 and data can be selectively accessed in a single cell in a column at a time using word lines 412—and via the corresponding bit line and bit line complement.

Multiplexers 416 is a functional block that includes a number of multiplexer circuit elements, the multiplexer circuit elements including read multiplexers and write multiplexers. For example, in some embodiments, multiplexers 416 includes circuit elements that perform multiplex-demultiplex functions for the read and write multiplexers depending on the direction of data flow, so that the circuit elements function as multiplexers as data flows from cells 404 for reads and as demultiplexers as data flows to cells 404 for writes. The read and write multiplexers are used for selecting columns from among the columns in memory array 402 from which data is read or to which data is written, respectively. In some embodiments, memory array 402 includes K columns of cells (e.g., 32, 64, or another number), but only K/2 columns, or another fraction of the columns, are accessed at a time. In other words, of the K columns, for each write or read operation, only a portion (half, a quarter, etc.) of the columns are read or written. The multiplexers in multiplexers 416 are therefore used for selecting the columns that are to be read or written.

Sense amplifiers and write drivers 418 is a functional block that includes sense amplifier and write driver circuit elements. The sense amplifiers are differential sense amplifiers that are used during read operations for detecting data values (e.g., 0s or 1s) in cells in memory array 402 based on bit and bit complement values that are passed through read multiplexers in multiplexers 416—and thus there is a separate sense amplifier for each read multiplexer in multiplexers 416. The write drivers are used during write operations for driving data values through write multiplexers in multiplexers 416 onto bit lines and bit complement lines from among bit lines 414 and thus to corresponding cells in columns of memory array 402 that are selected via word lines from among word lines 412.

Input/output elements 420 is a functional block that includes circuit elements for receiving data from and providing data to entities external to memory 400. Input/output elements 420 includes receiver circuit elements such as buffers, repeaters, latches, etc. that are used for receiving write data 442 that is to be written into memory array 402 from the entities and passing/forwarding received data to write drivers in sense amplifiers and write drivers 418. Input/output elements 420 includes driver circuit elements such as buffers, repeaters, latches, etc. that are used for receiving, from sense amplifiers in sense amplifiers and write drivers 418, data that was read from memory array 402 and sending the received read data 442 to the entities.

Row decoder 422 and column decoder (CDEC) 424 are functional blocks that perform operations associated with selecting data that is to be accessed in cells in memory array 402. Row decoder 422 receives row address 428 from an external entity (e.g., an external entity accessing the data), processes/decodes the row address 428 to determine a particular row of cells that is to be accessed from among the rows of cells in memory array 402, and asserts a signal on the corresponding word line from among word lines 412 to enable the cells in the particular row. Column decoder 424 receives column address 430 from the eternal entity, processes/decodes the column address 430 to determine particular columns that are to be accessed from among the columns of cells in memory array 402, and asserts a signal on a column select from among column selects (CSEL) 432 to cause the multiplexers in multiplexers 416 to access the particular columns. For example, when the access is a read, the column select causes read multiplexers to pass data (i.e., bit and bit complement pairs) from the particular columns to corresponding sense amps.

Control 426 is a functional block that performs operations for controlling when accesses are made of data in memory array 402. Control 426 receives, as inputs, various signals from external entities including read enable (RDEN) 434, write enable (WREN) 436, and clock (CLK) 438, and generates control signals in control signals (CTRL) 440 based at least in part thereon. For example, in some embodiments, control 426 generates, as part of control signals 440, signals for synchronizing/triggering operations in row decoder 422, column decoder 424, and other functional blocks in memory 400. As another example, in some embodiments, control 426 generates, as part of control signals 440, signals for precharging or setting sense amplifiers and/or write drivers and enabling the sense amplifiers and/or write drivers.

In some embodiments, clock 438 can operate at a number of different frequencies, which affects the timing of operations controlled by clock 438. For example, in a lower power operating mode, clock 438 may operate at a specified lower frequency (e.g., 400 mHz, 1 gHz, or another frequency), while in a higher power operating mode, clock 438 may operate at a specified higher frequency (e.g., 1.6 gHz, 2 gHz, or another frequency). In the described embodiments, certain short circuit paths through sense amplifier 504 (see FIG. 5) are avoided at lower clock 438 frequencies by generating a precharge signal for a precharging circuit in sense amplifier 504 using specified control signals, as described in more detail below.

Although memory 400 is shown as including a particular number and arrangement of functional blocks and elements, memory 400 is simplified for illustrative purposes. In some embodiments, memory 400 includes different and/or differently arranged functional blocks and/or elements. For example, in some embodiments, memory 400 includes a precharge functional block that precharges bit lines 414 before a read operation is performed. Generally, in the described embodiments, memory 400 includes sufficient functional blocks and elements to perform the operations described herein.

Figure 5:
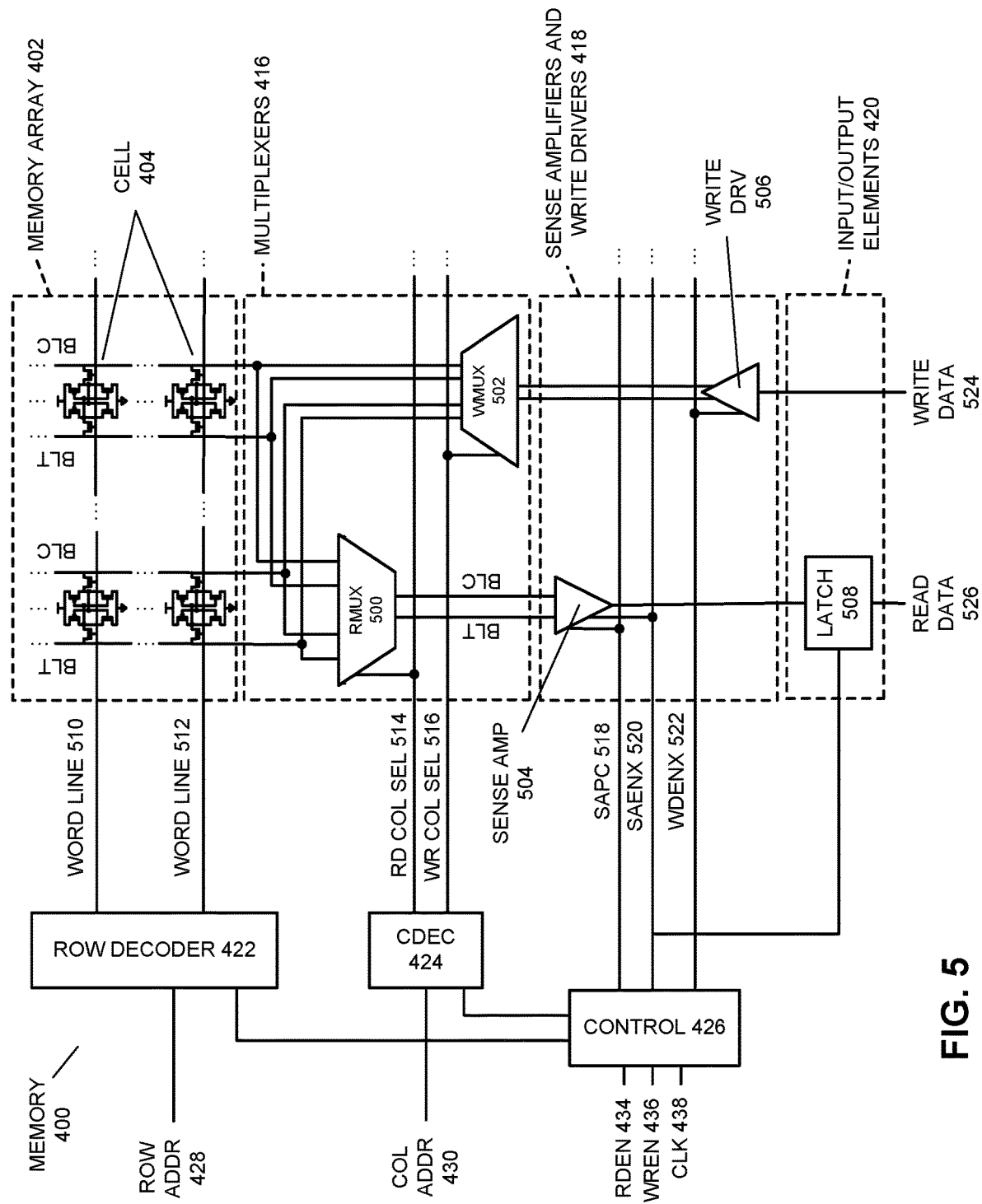
FIG. 5 presents a block diagram illustrating control signals for an SRAM memory in accordance with some embodiments.

FIG. 5 presents a block diagram illustrating control signals for memory 400 in accordance with some embodiments. For FIG. 5, several of the functional blocks, i.e., 400-numbered functional blocks such as memory array 402, row decoder 422, and column decoder 424, are described above in the description of FIG. 4. FIG. 5, however, includes a number of functional blocks and/or circuit elements that are not described in the description of FIG. 4. These functional blocks and circuit elements include read multiplexer 500, write multiplexer 502, sense amplifier (AMP) 504, write driver (DRV) 506, and latch 508. In addition, various control signals, which were generally described above as part of word lines 412, column select 432, or control signals 440 are separately illustrated in FIG. 5—and are described in more detail below.

For clarity, in the example shown in FIG. 5, there are only two cells 404 in each of two rows of cells 404 and two columns of cells 404. In some embodiments, however, memory array 402 includes more (and typically many more) rows of cells 404 and the rows include more cells 404—as shown using ellipses in FIG. 5. In addition, in some embodiments, memory array 402 includes more (and typically many more) columns of cells 404—as shown using ellipses in FIG. 5. In these embodiments, other functional blocks and circuit elements in FIG. 5 are increased in number accordingly. For example, the memory may be able to read out 32, 64, or another number of bits at a time from among 64, 128, or another number of columns of cells 404 having 128, 256, or another number of rows, and thus there are 32, 64, or another number of read multiplexers 500, sense amplifiers 504, latches 508, etc. Generally, in the described embodiments, memory 400 includes sufficient numbers of functional blocks and circuit elements to perform the operations described herein.

Word lines 510-512 are individual word lines from among word lines 412 that are connected to access transistors in rows of cells 404 in memory array 402. When asserted (e.g., set to a high logical value), each of word lines 510-512 enables access of cells 404 in the corresponding row of cells 404 in memory array 402. More specifically, when enabled during a read operation, word lines 510-512, which are connected to gate connections of access transistors for cells 404, activate the access transistors so that data values stored in storage transistors in the cells 404 in the corresponding row are made available on the bit lines to which each cell 404 is connected (i.e., with logically opposite values on bit line and bit line complement). On the other hand, when enabled during a write operation, word lines 510-512 activate the access transistors so that values on the bit lines can be driven through the access transistors and to the storage transistors for storage in the corresponding cells 404.

Read multiplexer 500 is a functional block that receives, on multiple separate inputs, signals from a pair of bit lines—shown as bit line (BLT) and bit line complement (BLC)—connected to access transistors for two separate columns of cells 404 in memory array 402 and passes values from a selected single pair of the bit lines to an output that is connected to sense amplifier 504. During a read operation, column decoder 424 sends a signal on read column select (RD COL SEL) 514 (e.g., a logical high value or a logical low value) that causes read multiplexer 500 to pass bit line values from a desired one of the two columns of cells 404 to sense amplifier 504. In some embodiments, read multiplexer 500 includes a single transistor or a transmission gate on each bit line that is activated or deactivated by read column select 514 in order to pass the value on the corresponding bit line to sense amplifier 504—or block the value on the corresponding bit line.

Write multiplexer 502, which is actually a demultiplexer in function, is a functional block that receives, on a pair of inputs, signals from a pair of signal lines connected to write driver 506 and passes, via a set of outputs connected to corresponding bit lines that are connected to access transistors for two columns of cells 404 in memory array 402, the received values to a pair of bit lines for a selected column of cells 404. During a write operation, column decoder 424 sends a signal on write column select (WR COL SEL) 516 (e.g., a logical high value or logical low value) that causes write multiplexer 502 to forward a value and its complement received from write driver 506 onto bit lines for a desired one of the columns of cells 404. For example, in some embodiments, write multiplexer 502 includes a single transistor or a transmission gate on each bit line that is activated or deactivated by write column select 516 in order to pass the value received from write driver 506 onto the corresponding bit line—or block the value on the corresponding bit line.

Sense amplifier 504 is a functional block that receives, from read multiplexer 500, values from a bit line and its complement and, based on the values, drives an output signal having a corresponding value to latch 508. For a read operation, during a precharge phase, control 426 sends a signal on the sense amplifier precharge (SAPC) 518 line to cause sense amplifier 504 to precharge its output nodes (i.e., SAT and SAC nodes of sense amplifier 504, as described below). Control 426 also, during an evaluate phase, sends a signal on the sense amplifier enable complement (SAENX) 520 line to cause sense amplifier 504 to evaluate the values on the output nodes (i.e., SAT and SAC nodes) and drive corresponding values (i.e., a value and its complement) onto the output nodes. The value driven on the SAT node of sense amplifier 504 is received as an input by latch 508. Note that if the signals on the sense amplifier precharge 518 line and sense amplifier enable complement 520 line are permitted to be in a logical low state (e.g., approximately VDD) at the same time, a short circuit path occurs through sense amplifier 504. In the described embodiments, the signals on the sense amplifier precharge 518 line and sense amplifier enable complement 520 line are controlled to avoid these signals simultaneously being the logical low state.

Write driver 506 is a functional block that receives write data 524, i.e., data to be written to a cell 404 in memory array 402, from an external entity on an input and drives the write data 524 and its complement to write multiplexer 502, from where write data 524 and its complement are passed to a selected column of cells 404 in memory array 402. During a write operation, control 426 sends a signal on the write driver enable complement (WDENX) 522 line to cause write driver 506 to drive write data 524 to write multiplexer 502.

Latch 508 is a functional block that receives a value from an output node (i.e., the SAT node) of sense amplifier 504 and stores the value. Latch 508 also provides the value as read data 526 to an external entity. During a read operation, control 426 sends a signal on the sense amplifier enable complement 520 line to cause latch 508 to capture/store the data on the output node of sense amplifier 504 and to provide the data to the external entity.

Although not shown in FIG. 5, in some embodiments, the bitlines (BLT and BLC) are connected to precharge circuit elements that precharge the bitlines prior to read operations. In these embodiments, a bitline precharge (BLPC) signal line is connected to each of the bitlines.

Sense Amplifier and Latch

Figure 6:
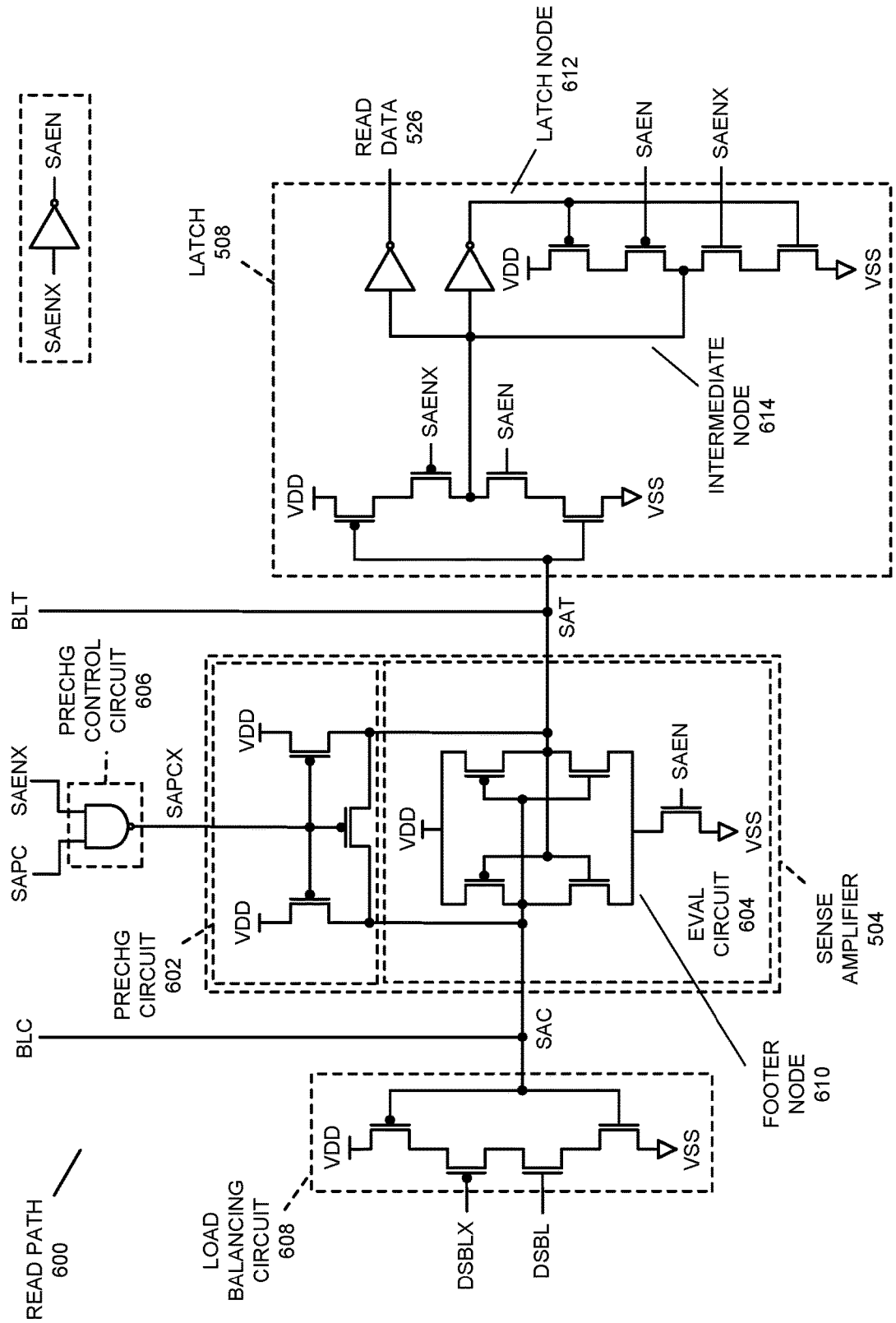
FIG. 6 presents a block diagram illustrating a sense amplifier and a latch in a read path for an SRAM memory in accordance with some embodiments.

In the described embodiments, a read path, which is a set of circuits used for reading data from SRAM cells in a memory array (e.g., cells 404 in memory array 402), includes a sense amplifier and a latch. FIG. 6 presents a block diagram illustrating sense amplifier 504 and latch 508 in read path 600 in accordance with some embodiments.

For the example in FIG. 6, read path 600 includes a number of improvements over existing SRAM cell read paths. First, latch 508 has only two gate delays between the SAT output of sense amplifier 504 and the read data 526 output of latch 508, which is one less gate delay than existing designs. Second, the sense amplifier precharge complement (SAPCX) signal via which sense amplifier 504 is precharged is generated based on a sense amplifier precharge (SAPC) signal and a sense amplifier enable complement (SAENX) signal. Using the SAENX signal to generate the SAPCX signal helps to avoid short circuit paths involving precharge circuit 602 in read path 600. Third, read path 600 includes load balancing circuit 608 connected to the SAC output of sense amplifier 504. In view of the capacitive load of tri-state inverter in latch 508 connected to the SAT output of sense amplifier 504, load balancing circuit 608 balances the capacitive load on sense amplifier 504 and helps to ensure that sense amplifier 504 outputs signals having approximately the same rise and fall times.

For the example, in FIG. 6, the gate, source, and drain connections of various PMOS transistors (p-channel metal oxide silicon field effect transistors) and NMOS transistors (n-channel metal oxide silicon field effect transistors) are connected to respective signals or are connected to source or drain connections of other PMOS and NMOS transistors. For instance, the input tri-state inverter in latch 508 has four transistors, two PMOS transistors and two NMOS transistors. The first PMOS transistor has a source connection that is connected to VDD, a drain connection that is connected to the source connection of the second PMOS transistor, and a gate connection that is connected to the SAT node of sense amplifier 504. The second PMOS transistor has a source connection that is connected to the drain connection of the first PMOS transistor, a drain connection that is connected to intermediate node 614 in latch 508, and a gate connection that is connected to the SAENX signal from control 426. In other words, the first and second PMOS transistors of the input tri-state inverter in latch 508 are coupled between VDD and intermediate node 614. The first NMOS transistor has a source connection that is connected to the drain connection of the second PMOS transistor, a drain connection that is connected to intermediate node 614, and a gate connection that is connected to the SAEN signal (i.e., the complement of the SAENX signal). The second NMOS transistor has a source connection that is connected to VSS, a drain connection that is connected to a source connection of the first PMOS transistor, and a gate connection that is connected to the SAT node of sense amplifier 504. In other words, the first and second NMOS transistors of the input tri-state inverter in latch 508 are coupled between intermediate node 614 and VSS. In the interest of brevity, the reader is referred to FIG. 6 for an illustration of the remaining gate, source, and drain connections of the NMOS and PMOS transistors in read path 600.

For the example in FIG. 6, a number of different signals are connected to gate connections of one or more transistors. Among the signals are the sense amplifier enable (SAEN) signal and its complement, the sense amplifier enable complement (SAENX) signal. The SAENX signal is generated by control 426. The SAEN signal is generated via an inverter such as the example shown in the top right of FIG. 6 (or another inverting logic gate). Also, among the signals is the sense amplifier precharge (SAPC) signal, which is generated by control 426. Additionally, among the signals are the disable (DSBL) and disable complement (DSBLX) signals, which are either generated by control 426 or are fixed, such as by connecting the gate connections of the illustrated transistors to VDD and VSS, respectively.

As can be seen in FIG. 6, sense amplifier 504 includes precharge (PRECHG) circuit 602 and evaluate (EVAL) circuit 604. Precharge circuit 602 precharges the SAT and SAC nodes of sense amplifier 504 to approximately VDD during a precharge phase for sense amplifier 504. During an evaluate phase following the precharge phase, control 426 asserts the sense amplifier enable (SAEN) signal to activate a pulldown transistor connected to footer node 610 in evaluate circuit 604. The pulldown transistor, when activated, enables sense amplifier 504 to evaluate as an amplifier—and thus reduce the voltage—from one of the SAT and SAC nodes based on values of the bit line (BLT) and bit line complement (BLC) signal lines, which are supplied to sense amplifier 504 from read multiplexer 500.

Precharge circuit 602 is controlled by the SAPCX signal, which is generated by precharge (PRECHG) control circuit 606 based on the SAPC and SAENX signals. In operation, SAPCX has a logical high value (e.g., approximately VDD), and all of the PMOS gates in precharge circuit 602 are disabled (thereby disabling precharge circuit 602), when either of the SAPC or SAENX signals have a logical low value (e.g., approximately VSS). This occurs at all times other than when the SAENX signal is set to a logical high value, disabling the evaluate circuit via its complement (i.e., the SAEN signal), and SAPC is set to a logical high value to enable precharge circuit 602 during the precharge phase. When the SAPC signal is set to a logical high value during the precharge phase and the SAEN signal is set to a logical low value outside the evaluate phase, the SAPCX signal is driven low, activating the PMOS gates in precharge circuit 602 and thereby activating precharge circuit 602. As described above, when activated, precharge circuit 602 precharges the SAT and SAC nodes to approximately VDD. By operating in this way, the pulldown transistor connected to footer node 610 in evaluate circuit 604 and controlled by SAEN is disabled before precharging starts. This can help to avoid the formation of a short circuit path though precharge circuit 602 and evaluate circuit 604. In addition, by operating in this way, a functional race that involves precharge circuit 602 contesting the storage elements in latch 508 during potential overlaps between SAPCX and SAEN/SAENX is avoided.

In some embodiments, precharge control circuit 606 includes a NAND logic gate as shown in FIG. 6. This is not, however, a requirement. Generally, any logic gate and/or circuit element that generates SAPCX based on SAPC and SAENX as described above can be used in the described embodiments.

Latch 508 includes an input tri-state inverter that is connected between the SAT node of sense amplifier 504 and intermediate node 614 of latch 508. The input tri-state inverter is enabled, and therefore passes inverted values to intermediate node 614 of latch 508, based on values of the SAEN/SAENX signals. When the SAEN signal is set to a logical high value (and thus sense amplifier 504 is in the evaluate phase), the SAENX signal is set to a logical low value and the input tri-state inverter is active—and passes the inverted value from the SAT node of sense amplifier 504 to intermediate node 614 of latch 508. In contrast, when the SAEN signal is set to a logical low value, the SAENX signal is set to a logical high value, the input tri-state inverter is deactivated and does not pass values from the SAT node of sense amplifier 504 to intermediate node 614 of latch 508. By operating as described, the input tri-state inverter blocks values from propagating from the SAT node of sense amplifier 504 to intermediate node 614 of latch 508 except during the evaluate phase of sense amplifier 504. Note that, by controlling the input tri-state inverter using the SAEN and SAENX signals, the described embodiments avoid short circuit currents through the tri-state inverter that occur when the SAT and/or SAC nodes discharge slowly for lower operating frequencies of the controlling clock. If a circuit element such as an inverter that lacks these controls were to be used instead of the input tri-state inverter, these short circuits could occur—and cause functional issues in the latch.

Latch 508 also includes storage circuit elements having: (1) a latch inverter that is connected between intermediate node 614 and latch node 612 and (2) a latch tri-state inverter that is connected between latch node 612 and intermediate node 614. In other words, the latch inverter and the latch tri-state inverter of the storage circuit elements form a back to back inverter pair that is used for storing data values in latch 508 (and, more generally, in read path 600). In operation, when SAEN is set to a logical high value and SAENX is set to a logical low value, and thus evaluate circuit 604 in sense amplifier 504 is enabled and the input tri-state inverter is propagating values from the SAT node to intermediate node 614, the latch tri-state inverter is disabled. This prevents the latch tri-state inverter from competing with the input tri-state inverter with regard to the value on intermediate node 614. In contrast, when SAEN is set to a logical low value and SAENX is set to a logical high value, and thus the input tri-state inverter is disabled and not driving a value onto intermediate node 614, the latch tri-state inverter is enabled and sustains, in combination with the latch inverter, the value on intermediate node 614. Latch 508 further includes an output inverter connected between intermediate node 614 and a read data 526 output. The output inverter drives values from intermediate node 614 to the read data 526 output—and thus to external entities. Note that, in some embodiments, the output inverter is replaced by another type of output driver, such as a tri-state inverter with an output enable and its complement serving as controls, a NAND gate, etc.

Read path 600 additionally includes load balancing circuit 608. Load balancing circuit 608 includes a load balancing tri-state inverter with four transistors—two PMOS and two NMOS transistors. The gate connections of two transistors of the tri-state inverter, shown as the outer PMOS and NMOS transistors, are connected to the SAC node of sense amplifier 504 to provide a capacitive load on the SAC node that approximately balances the capacitive load on the SAT node of the input tri-state inverter of latch 508. In the example in FIG. 6, the gate connections of the other two transistors of the tri-state inverter, shown as the inner PMOS and NMOS transistors, are connected to disable and disable complement signals, which are constant signals that keep the inner PMOS and NMOS transistors in an off state (i.e., disabled, non-conducting, etc.). In some embodiments, however, the disable and disable complement signals are replaced by SAEN and SAENX, which can help load balancing circuit 608 to provide a more similar capacitive load to the input tri-state inverter in latch 508.

Sharing Latches in Read Paths for a Multi-Banked Memory

Figure 7:
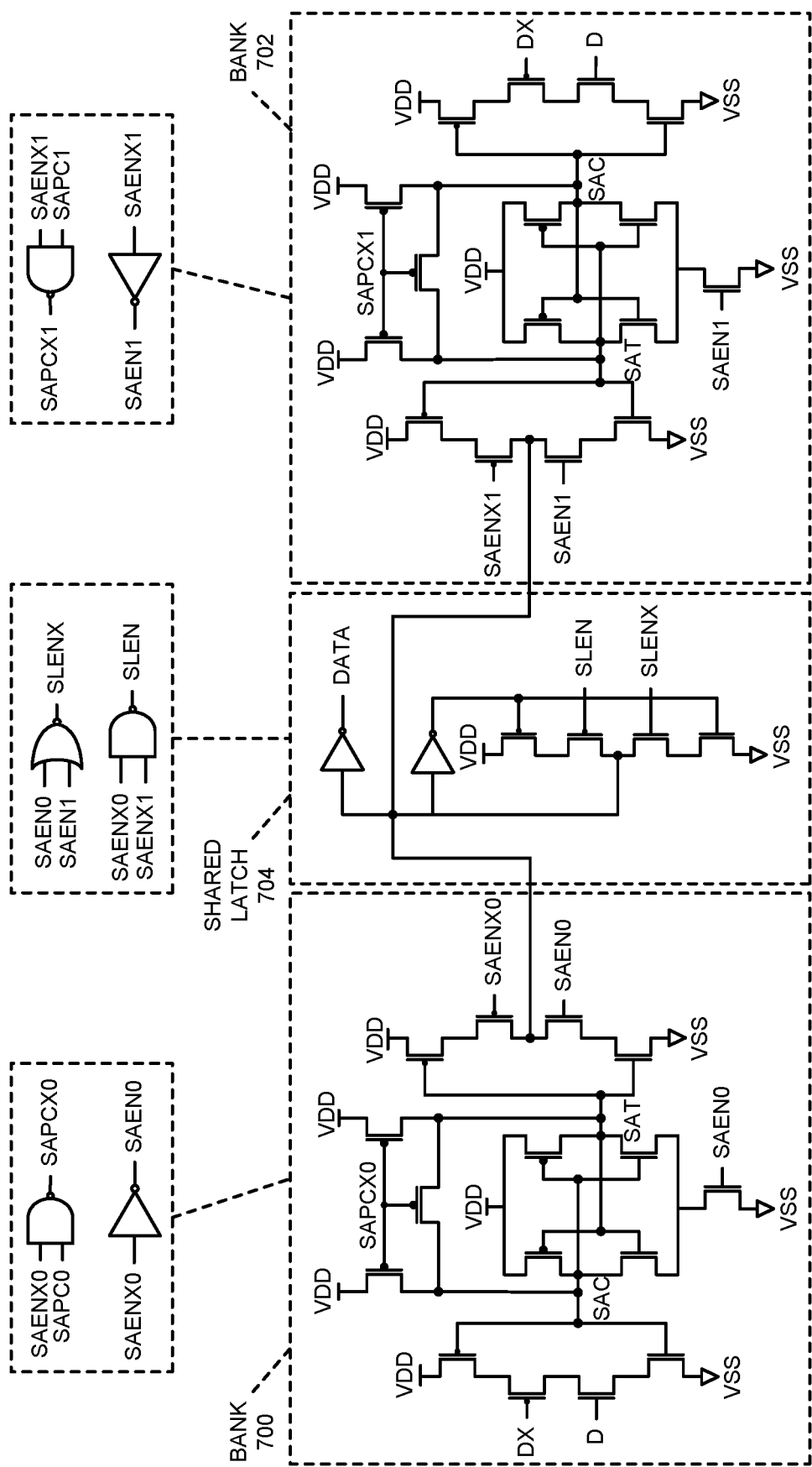
FIG. 7 presents a block diagram illustrating a shared latch in a read path for SRAM cells in accordance with some embodiments.

In some embodiments, at least some of the circuit elements of a latch are shared in read paths for SRAM cells in two or more banks of memory. FIG. 7 presents a block diagram illustrating a shared latch in a read path for SRAM cells in accordance with some embodiments. Note that, although certain functional blocks and circuit elements are shown in a particular arrangement in FIG. 7, FIG. 7 is simplified for clarity. In some embodiments, each bank includes a memory array and other such functional blocks and circuit elements such as those shown in FIGS. 4-6. Generally, in the described embodiments, a latch can be shared among multiple read paths, but is otherwise similar in arrangement and function to latch 508.

In FIG. 7, a separate part of a read path in each of banks 700 and 702 includes a sense amplifier and corresponding load balancing circuit. The latch in the read paths for banks 700 and 702 is divided so that each bank includes its own separate latch input tri-state inverter. The separate latch input tri-state inverter in each bank is connected to enabling signals for that bank, i.e., SAEN0/SAENX0 for bank 700 and SAEN1/SAENX1 for bank 702. The storage circuit elements for the latch, i.e., the latch inverter and latch tri-state inverter, and the output inverter for the latch are shared between banks 700 and 702. These parts of the latch are shown as shared latch 704 in FIG. 7. These parts of the latch are selectively used by banks 700 and 702—and can store and output data values for one of banks 700 and 702 at a time.

Control signals for the read paths in each of banks 700 and 702 and the shared parts of the latch in shared latch 704 are shown above these elements in FIG. 7. As can be seen in FIG. 7, the control signals for each bank, which include a sense amplifier precharge (SAPCX0/1) and sense amplifier enable (SAEN0/1) are generated similarly to how those signals are generated in FIGS. 4-6. The control signals for the shared part of the latch are generated based on the control signals for the banks. More specifically, the SLEN signal for the shared part of the latch is generated as a logical (e.g., NAND) combination of the SAENX0/1 signals, and the SLENX signal for the shared part of the latch is generated as a logical (e.g., NOR) combination of the SAEN0/1 signals. In some embodiments, the disable (D) and disable complement (DX) signals are replaced by the respective sense amplifier enable (SAEN0/1) and sense amplifier enable complement (SAENX0/1) signals for each bank.

Process for Reading Data from a Cell in a Memory Array

Figure 8:
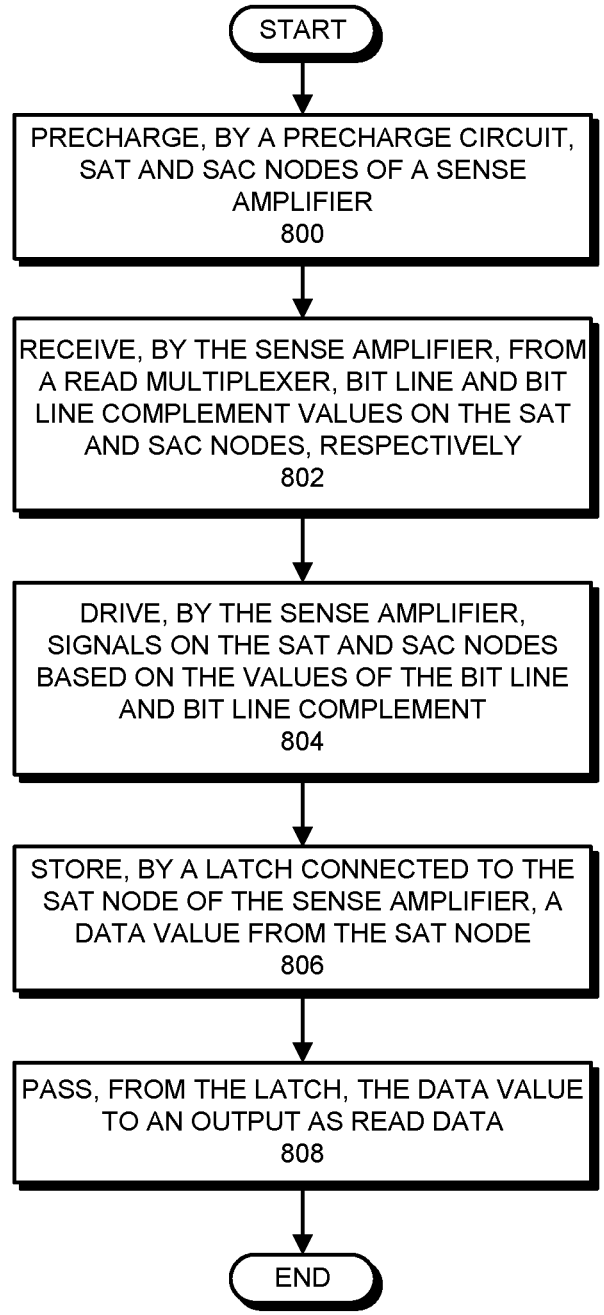
FIG. 8 presents a flowchart illustrating a process for performing a read of an SRAM memory in accordance with some embodiments.

In the described embodiments, data is read from SRAM cells in a memory array (e.g., memory array 402) using various circuit elements on a read path (e.g., read path 600). FIG. 8 presents a flowchart illustrating a process for performing a read of an SRAM memory in accordance with some embodiments. Note that the operations shown in FIG. 8 are presented as a general example of operations performed by some embodiments. The operations performed by other embodiments include different operations, operations that are performed in a different order, and/or operations that are performed by different entities or functional blocks.

For the operations in FIG. 8, it is assumed that data has been read from a cell (e.g., cell 404) in a column of cells in the memory array. In other words, the bit line and bit line complement connected to the cell have been precharged (e.g., to approximately VDD) and thus the sense amplifier is no longer in a precharge phase, a row decoder (e.g., row decoder 422) has asserted a desired word line to enable the access transistors of the cell, thereby enabling storage transistors in the cell to drive the value of a bit of data stored in the cell and its logical complement onto a corresponding bit line and bit line complement, respectively. In addition, a column decoder (e.g., column decoder 424) has enabled the corresponding read multiplexer (e.g., read multiplexer 500) to pass the value from the bit line and bit line complement to a sense amplifier (e.g., sense amplifier 504).

For the operations in FIG. 8, only a single cell of a memory array is read. In some embodiments, however, multiple cells (e.g., 32, 64, or another number) are read simultaneously and in parallel via separate read paths during a given read operation. The operations for reading each of the individual cells are similar to those described for FIG. 8.

The operations in FIG. 8 start when a precharge circuit (e.g., precharge circuit 602) precharges SAT and SAC nodes of a sense amplifier (step 802). For this operation, a precharge control circuit (e.g., precharge control circuit 606), based on values of SAPC and SAENX signals, drives the SAPCX signal to a logical low level to enable PMOS transistors in the precharge circuit to precharge the SAT and SAC nodes in the sense amplifier.

The sense amplifier then receives, from the read multiplexer, bit line and bit line complement values on the SAT and SAC nodes (step 802) and drives signals on the SAT and SAC nodes based on the values of the bit line and bit line complement (step 804). During this operation, based on a difference in the voltage of the SAT and SAC nodes that is caused by the bit line and/or bit line complement values (i.e., voltages), the sense amplifier drives/outputs signals on the SAT and SAC nodes—i.e., "senses" a difference and outputs values on the SAT and SAC nodes accordingly. The sense amplifier is enabled by the SAEN signal, which is the logical complement of the SAENX signal, so that the SAPCX signal transitions to a high logical level to disable precharging when the sense amplifier is enabled—thereby avoiding a potential short circuit path in the sense amplifier.

A latch (e.g., latch 508) connected to the SAT node of the sense amplifier stores a value from the SAT node (step 806). For this operation, an input tri-state inverter of the latch is enabled by the SAEN signal and thus the input tri-state inverter drives an inverted version of the value from the SAT node onto an intermediate node of the latch (e.g., intermediate node 614). From the intermediate node of the latch, the value is passed to an output (via an output driver) as read data (step 808). Note that a latch tri-state inverter in storage circuit elements of the latch is disabled while the sense amplifier is enabled, i.e., while SAEN is at a high logical level, but becomes enabled as SAEN transitions to a low logical level, thereby enabling the latch to store the value from the SAT node.

In some embodiments, at least one electronic device (e.g., electronic device 300) uses code and/or data stored on a non-transitory computer-readable storage medium to perform some or all of the operations herein described. More specifically, the at least one electronic device reads code and/or data from the computer-readable storage medium and executes the code and/or uses the data when performing the described operations. A computer-readable storage medium can be any device, medium, or combination thereof that stores code and/or data for use by an electronic device. For example, the computer-readable storage medium can include, but is not limited to, volatile and/or non-volatile memory, including flash memory, random access memory (e.g., eDRAM, RAM, SRAM, DRAM, DDR4 SDRAM, etc.), non-volatile RAM (e.g., phase change memory, ferroelectric random access memory, spin-transfer torque random access memory, magnetoresistive random access memory, etc.), read-only memory (ROM), and/or magnetic or optical storage mediums (e.g., disk drives, magnetic tape, CDs, DVDs, etc.).

In some embodiments, one or more hardware modules perform the operations herein described. For example, the hardware modules can include, but are not limited to, one or more processors/cores/central processing units (CPUs), application-specific integrated circuit (ASIC) chips, neural network processors or accelerators, field-programmable gate arrays (FPGAs), compression and/or encoding subsystems, compute units, embedded processors, graphics processors (GPUs)/graphics cores, accelerated processing units (APUs), functional blocks, controllers, accelerators, and/or other programmable-logic devices. When circuitry (e.g., integrated circuit elements, discrete circuit elements, etc.) in such hardware modules is activated, the circuitry performs some or all of the operations. In some embodiments, the hardware modules include general purpose circuitry such as execution pipelines, compute or processing units, etc. that, upon executing instructions (program code, firmware, etc.), perform the operations. In some embodiments, the hardware modules include purpose-specific or dedicated circuitry that is configured to perform the operations, possibly including circuitry that performs some or all of the operations without executing instructions.

In some embodiments, a data structure representative of some or all of the functional blocks and circuit elements described herein (e.g., electronic device 300 or some portion thereof) is stored on a non-transitory computer-readable storage medium that includes a database or other data structure which can be read by an electronic device and used, directly or indirectly, to fabricate hardware including the functional blocks and circuit elements. For example, the data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of transistors/circuit elements from a synthesis library that represent the functionality of the hardware including the above-described functional blocks and circuit elements. The netlist may then be placed and routed to produce a data set describing geometric shapes to be applied to masks. The masks may then be used in various semiconductor fabrication steps to produce a semiconductor circuit or circuits (e.g., integrated circuits) corresponding to the above-described functional blocks and circuit elements. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N, M, and X As used herein, despite possibly using similar letters in different locations in this description, the variables and unspecified values in each case are not necessarily the same, i.e., there may be different variable amounts and values intended for some or all of the general variables and unspecified values. In other words, N and any other letters used to represent variables and unspecified values in this description are not necessarily related to one another.

The expression "et cetera" or "etc." as used herein is intended to present an and/or case, i.e., the equivalent of "at least one of" the elements in a list with which the etc. is associated. For example, in the statement "the electronic device performs a first operation, a second operation, etc.," the electronic device performs at least one of the first operation, the second operation, and other operations. In addition, the elements in a list associated with an etc. are merely examples from among a set of examples—and at least some of the examples may not appear in some embodiments.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. A read path for reading data from a memory in an electronic device, comprising:
    a sense amplifier that includes data (SAT) and data complement (SAC) nodes; and
    a latch that includes:
        an input tri-state inverter coupled between the SAT node and an intermediate node;
        storage circuit elements including:
            a latch inverter coupled between the intermediate node and a latch node; and
            a latch tri-state inverter coupled between the latch node and the intermediate node; and
        an output driver coupled between the intermediate node and a data output node.

2. The read path of claim 1, further comprising:
    a load balancing circuit including:
        a load balancing tri-state inverter including third and fourth PMOS transistors and third and fourth NMOS transistors coupled between VDD and VSS, with:
            a gate connection of the third PMOS transistor and the third NMOS transistor coupled to the SAC node; and
            a gate connection of the fourth PMOS transistor and the fourth NMOS transistor coupled to disabling inputs that maintain the fourth PMOS transistor and the fourth NMOS transistor in an off state.

3. The read path of claim 1, further comprising:
    a precharge circuit in the sense amplifier, the precharge circuit coupled to the SAT and SAC nodes and configured to precharge the SAT and SAC nodes; and
    a precharge control circuit including:
        a sense amplifier precharge (SAPC) input;
        an SAENX input; and
        a sense amplifier precharge complement (SAPCX) output coupled to the precharge circuit and configured to control when the precharge circuit precharges the SAT and SAC nodes, the precharge control circuit driving a signal on the SAPCX output based on values of the SAPC and SAENX inputs.

4. The read path of claim 3, wherein the precharge control circuit includes:
    a NAND logic gate having a first input coupled to the SAPC input, a second input coupled to the SAENX input, and a first output coupled to the SAPCX output.

5. The read path of claim 3, wherein the precharge circuit includes:
    a first PMOS transistor coupled between VDD and the SAC node;
    a second PMOS transistor coupled between VDD and the SAT node; and
    a third PMOS transistor coupled between the SAT and SAC nodes with a gate connection for the first, second, and third PMOS transistors coupled to the SAPCX output.

6. The read path of claim 1, wherein:
    the latch inverter includes a latch inverter input coupled to the intermediate node and a latch inverter output coupled to the latch node; and
    the latch tri-state inverter includes third and fourth PMOS transistors coupled between VDD and the intermediate node and third and fourth NMOS transistors coupled between VSS and the intermediate node, with:
        a gate connection of the third PMOS transistor and the third NMOS transistor coupled to the latch node;
        a gate connection of the fourth PMOS transistor coupled to the SAEN input; and
        a gate connection of the fourth NMOS transistor coupled to the SAENX input.

7. The read path of claim 1, wherein the sense amplifier includes:
    a bit input coupled to the SAT node;
    a bit complement input coupled to the SAC node; and
    an evaluate circuit coupled to the SAT and SAC nodes and configured to output an SAT signal on the SAT node and an SAC signal on the SAC node based on values of the bit and bit complement inputs.

8. The read path of claim 7, further comprising:
    one or more synchronous random access memory (SRAM) cells, each SRAM cell including bit and bit complement outputs, the bit outputs and the bit complement outputs for the one or more SRAM bit cells being coupled to the bit input and the bit complement input, respectively, for the sense amplifier.

9. The read path of claim 7, wherein the evaluate circuit includes:
    a first PMOS transistor and a first NMOS transistor coupled between VDD and a footer node with the SAC node coupled to a first middle node between the first PMOS and first NMOS transistors and the SAT node coupled to a gate connection for the first PMOS and first NMOS transistors;
    a second PMOS transistor and a second NMOS transistor coupled between VDD and a footer node with the SAT node coupled to a second middle node between the second PMOS and second NMOS transistors and the SAC node coupled to a gate connection for the second PMOS and second NMOS transistors; and
    a third NMOS transistor coupled between the footer node and VSS with a gate connection for the third NMOS transistor coupled to the SAEN input.

10. An electronic device, comprising:
    a processing subsystem; and
    a memory coupled to the processing subsystem, the memory including at least one read path for reading data from the memory, the at least one read path comprising:
        a sense amplifier that includes data (SAT) and data complement (SAC) nodes; and a latch that includes:
an input tri-state inverter coupled between the SAT node and an intermediate node;
storage circuit elements including:
a latch inverter coupled between the intermediate node and a latch node; and
a latch tri-state inverter coupled between the latch node and the intermediate node; and
an output driver coupled between the intermediate node and a data output node.

11. The electronic device of claim 10, wherein the at least one read path further comprises:
a load balancing circuit including:
a load balancing tri-state inverter including third and fourth PMOS transistors and third and fourth NMOS transistors coupled between VDD and VSS, with:
a gate connection of the third PMOS transistor and the third NMOS transistor coupled to the SAC node; and
a gate connection of the fourth PMOS transistor and the fourth NMOS transistor coupled to disabling inputs that maintain the fourth PMOS transistor and the fourth NMOS transistor in an off state.

12. The electronic device of claim 10, wherein the at least one read path further comprises:
a precharge circuit in the sense amplifier, the precharge circuit coupled to the SAT and SAC nodes and configured to precharge the SAT and SAC nodes; and
a precharge control circuit including:
a sense amplifier precharge (SAPC) input;
an SAENX input; and
a sense amplifier precharge complement (SAPCX) output coupled to the precharge circuit and configured to control when the precharge circuit precharges the SAT and SAC nodes, the precharge control circuit driving a signal on the SAPCX output based on values of the SAPC and SAENX inputs.

13. The electronic device of claim 12, wherein the precharge control circuit includes:
a NAND logic gate having a first input coupled to the SAPC input, a second input coupled to the SAENX input, and a first output coupled to the SAPCX output.

14. The electronic device of claim 12, wherein the precharge circuit includes:
a first PMOS transistor coupled between VDD and the SAC node;
a second PMOS transistor coupled between VDD and the SAT node; and
a third PMOS transistor coupled between the SAT and SAC nodes with a gate connection for the first, second, and third PMOS transistors coupled to the SAPCX output.

15. The electronic device of claim 10, wherein:
the latch inverter includes a latch inverter input coupled to the intermediate node and a latch inverter output coupled to the latch node; and
the latch tri-state inverter includes third and fourth PMOS transistors coupled between VDD and the intermediate node and third and fourth NMOS transistors coupled between VSS and the intermediate node, with:
a gate connection of the third PMOS transistor and the third NMOS transistor coupled to the latch node;
a gate connection of the fourth PMOS transistor coupled to the SAEN input; and
a gate connection of the fourth NMOS transistor coupled to the SAENX input.

16. The electronic device of claim 10, wherein the sense amplifier includes:
a bit input coupled to the SAT node;
a bit complement input coupled to the SAC node; and
an evaluate circuit coupled to the SAT and SAC nodes and configured to output an SAT signal on the SAT node and an SAC signal on the SAC node based on values of the bit and bit complement inputs.

17. The electronic device of claim 16, wherein the memory includes:
one or more synchronous random access memory (SRAM) cells, each SRAM cell including bit and bit complement outputs, the bit outputs and the bit complement outputs for the one or more SRAM bit cells being coupled to the bit input and the bit complement input, respectively, for the sense amplifier.

18. The electronic device of claim 16, wherein the evaluate circuit includes:
a first PMOS transistor and a first NMOS transistor coupled between VDD and a footer node with the SAC node coupled to a first middle node between the first PMOS and first NMOS transistors and the SAT node coupled to a gate connection for the first PMOS and first NMOS transistors;
a second PMOS transistor and a second NMOS transistor coupled between VDD and a footer node with the SAT node coupled to a second middle node between the second PMOS and second NMOS transistors and the SAC node coupled to a gate connection for the second PMOS and second NMOS transistors; and
a third NMOS transistor coupled between the footer node and VSS with a gate connection for the third NMOS transistor coupled to the SAEN input.

19. The read path of claim 1, wherein the input tri-state inverter includes first and second PMOS transistors coupled between VDD and the intermediate node and first and second NMOS transistors coupled between VSS and the intermediate node, with:
a gate connection of the first PMOS transistor and the first NMOS transistor coupled to the SAT node;
a gate connection of the second PMOS transistor coupled to a sense amplifier enable complement (SAENX) input; and
a gate connection of the second NMOS transistor coupled to a sense amplifier enable (SAEN) input.

20. The read path of claim 1, wherein the output driver includes an output driver input coupled to the intermediate node and an output driver output coupled to a data output node.

21. The electronic device of claim 10, wherein the input tri-state inverter includes first and second PMOS transistors coupled between VDD and the intermediate node and first and second NMOS transistors coupled between VSS and the intermediate node, with:
a gate connection of the first PMOS transistor and the first NMOS transistor coupled to the SAT node;
a gate connection of the second PMOS transistor coupled to a sense amplifier enable complement (SAENX) input; and
a gate connection of the second NMOS transistor coupled to a sense amplifier enable (SAEN) input.

22. The electronic device of claim 10, wherein the output driver includes an output driver input coupled to the intermediate node and an output driver output coupled to a data output node.

* * * * *